US006348389B1

(12) United States Patent
Chou et al.

(10) Patent No.: US 6,348,389 B1
(45) Date of Patent: Feb. 19, 2002

(54) METHOD OF FORMING AND ETCHING A RESIST PROTECT OXIDE LAYER INCLUDING END-POINT ETCH

(75) Inventors: Chen Cheng Chou, Taichung; Tzong-Sheng Chang, Chang-Hua, both of (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/266,312

(22) Filed: Mar. 11, 1999

(51) Int. Cl.[7] ................... H01L 21/336; H01L 21/3205; H01L 21/4763; H01L 21/302; H01L 21/461; H01L 21/00
(52) U.S. Cl. ................. 438/305; 438/586; 438/723; 438/724; 438/9
(58) Field of Search ..................... 438/253, 305, 438/396, 586, 261, 670, 656, 303, 655, 9, 706, 724, 723

(56) References Cited

U.S. PATENT DOCUMENTS

| | | | |
|---|---|---|---|
| 4,635,347 A | | 1/1987 | Lien et al. .................. 29/591 |
| 5,200,028 A | * | 4/1993 | Tatsumi |
| 5,286,667 A | * | 2/1994 | Lin et al. |
| 5,674,356 A | * | 10/1997 | Nagayama |
| 5,683,548 A | * | 11/1997 | Hartig et al. |
| 5,719,079 A | | 2/1998 | Yoo et al. .................. 438/238 |
| 5,723,893 A | | 3/1998 | Yu et al. .................... 257/413 |
| 5,757,045 A | | 5/1998 | Tsai et al. ................... 257/336 |
| 5,792,684 A | | 8/1998 | Lee et al. ................... 438/238 |
| 5,998,252 A | * | 12/1999 | Huang |
| 6,004,829 A | * | 12/1999 | Chang et al. |
| 6,013,943 A | * | 1/2000 | Cathey et al. |
| 6,025,267 A | * | 2/2000 | Pey et al. |

* cited by examiner

Primary Examiner—John F. Niebling
Assistant Examiner—Ron Pompey
(74) Attorney, Agent, or Firm—George O. Saile; Stephen B. Ackerman; William J. Stoffel

(57) ABSTRACT

The present invention provides a method for forming and etching a resist protect oxide layer, of which provides improved etch selectivity to a shallow trench isolation and an increased pre-metal dip processing window. The process begins by forming a shallow trench isolation on a semiconductor substrate. The semiconductor substrate has a first area and a second area separated by the shallow trench isolation. A gate is formed on the semiconductor substrate in the first area, adjacent to the shallow trench isolation. In a key step, a resist protect oxide layer comprising a thin silicon oxide layer and an overlying thin nitrogen containing layer, is deposited over the semiconductor substrate, the gate, and the shallow trench isolation. The thin nitrogen containing layer can be composed of silicon nitride or silicon oxynitride. Alternatively, if the notrogen containing layer is composed of silicon oxynitride, the oxide layer can be omitted because oxynitride's stress is less than nitrogen, so the oxynitride could use a native oxide layer as the buffer oxide. The resist protect oxide layer is patterned in an RPO etch step; thereby exposing the first area, including the source and drain regions. A key advantage of the invention is that the RPO etch step can be performed in an endpoint mode where the endpoint is detected by the nitrogen content of the etch chamber ambient. Silicide regions can then be formed on the source and drain regions. A second key advantage of the invention is that the nitrogen containing layer of the resist protect oxide layer has a slower etch rate during pre-metal dip than a resist protect oxide layer composed of only oxide.

6 Claims, 3 Drawing Sheets

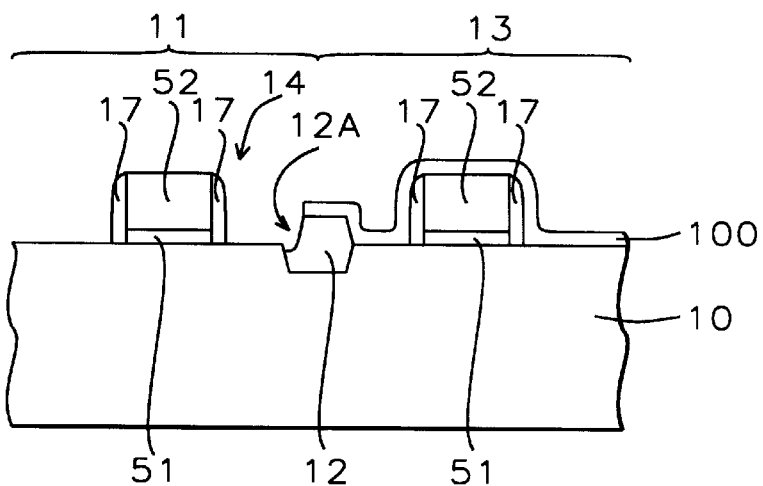
FIG. 1 – Prior Art
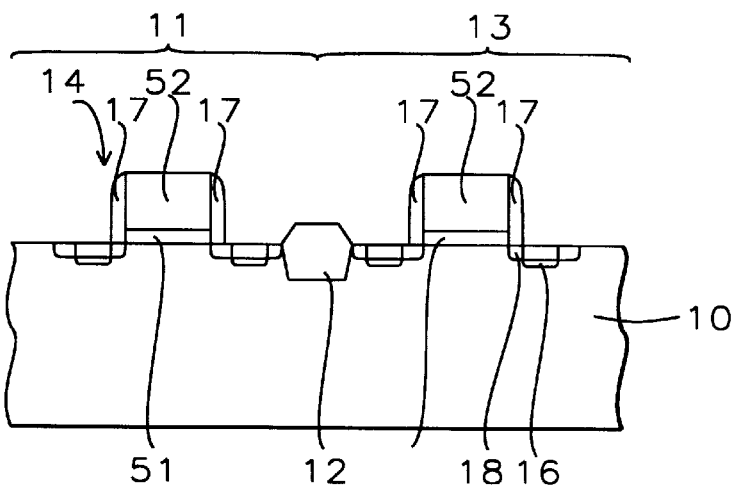
FIG. 2
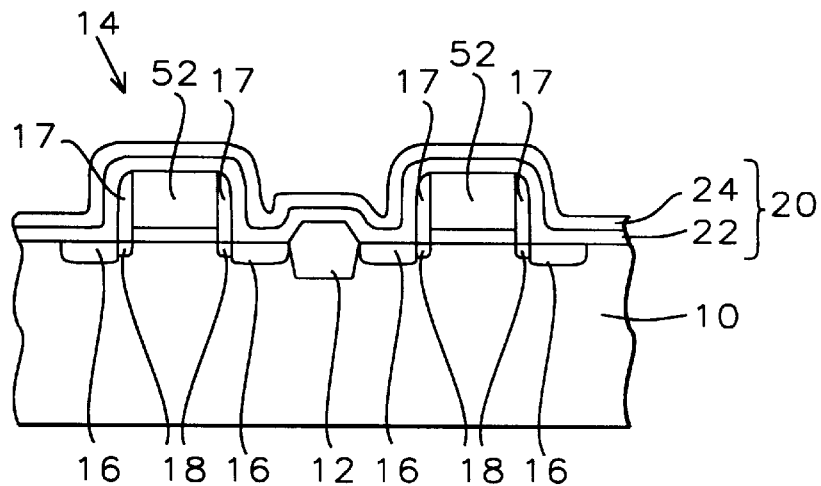
FIG. 3

US 6,348,389 B1

METHOD OF FORMING AND ETCHING A RESIST PROTECT OXIDE LAYER INCLUDING END-POINT ETCH

BACKGROUND OF INVENTION

1) Field of the Invention

This invention relates generally to fabrication of semiconductor devices and more particularly to a method of forming and etching a resist protect oxide (RPO) layer which has improved etch selectivity to a shallow trench isolation and an increased pre-metal dip processing window.

2) Description of the Prior Art

Shallow trench isolations (STI) are widely used in semiconductors manufacturing to provide isolation of active areas on a substrate. The inventors use a resist protect oxide (RPO) in conjunction with an STI to mask a first area while selectively forming silicide on a second area. However, STI's are susceptible to a problem known as the corner recess problem. Device processing requires an RPO etch step (wet etch) after the STI has undergone chemical mechanical polishing (CMP) to its final size. To assure that the RPO layer is completely removed an overetch is used. This overetch inevitably etches away part of the exposed STI causing corners of the STI to be recessed. Recessed corners can cause junction leakage associated with salicide formation.

Another problem with the inventors' RPO process is that the subsequent pre-metal (wet etch) dip processing window is narrow. If too little etch is performed during pre-metal dip, traces of oxide or other contaminants may remain on the poly layer causing the poly layer to be unstable. Too much etch during pre-metal dip will remove too much of the RPO layer, which can cause silicide formation on the I/O area (e.g. masked second area). Because of this narrow processing window, it is extremely difficult to successfully perform rework of the pre-metal dip step.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,635,347 (Lien et al.) shows a self-aligned TiSi$_x$ gate and contact forming process.

U.S. Pat. No. 5,792,684 (Lee et al.) shows a SiN layer overlying a FOX structure.

U.S. Pat. No. 5,757,045 (Tsai et al.), U.S. Pat. No. 5,723,893 (Yu et al.), and U.S. Pat. No. 5,605,853 (Yoo) show TiSi$_x$ processes.

SUMMARY OF THE INVENTION

It is an object of the present invention to provide a method for forming and etching a resist protect oxide layer which provides a reduced corner recess in a shallow trench isolation.

It is another object of the present invention to provide a method for forming and etching a resist protect oxide layer which provides an increased pre-metal dip processing window.

It is yet another object of the present invention to provide a method for forming and etching a resist protect oxide layer which allows for rework of a subsequent pre-metal dip step.

To accomplish the above objectives, the present invention provides a method for forming and etching a resist protect oxide layer, which provides improved etch selectivity to a shallow trench isolation and an increased pre-metal dip processing window. The process begins by forming a shallow trench isolation on a semiconductor substrate having a first area and a second area. A gate is formed on the semiconductor substrate in the first area, adjacent to the shallow trench isolation. Impurity ions are implanted into the semiconductor substrate to form source and drain regions. In a key step, a resist protect oxide layer comprising a thin silicon oxide layer (22) and an overlying thin nitrogen containing layer (24), is deposited over the semiconductor substrate, the gate, and the shallow trench isolation. The thin nitrogen containing layer (24) can be composed of silicon nitride or silicon oxynitride. Alternatively, if the notrogen containing layer (24) is composed of silicon oxynitride, the oxide layer (22) can be omitted because oxynitride's stress is less than nitrogen, so the oxynitride could use a native oxide layer as the buffer oxide. The resist protect oxide layer is patterned in an RPO etch step; thereby exposing the first area, including the source and drain regions. A key advantage of the invention is that the RPO etch step can be performed in an end-point mode where the endpoint is detected by the nitrogen content of the etch chamber ambient. Silicide regions can then be formed on the source and drain regions. Semiconductor fabrication continues using conventional process to form dielectric layers, contacts and interconnections.

The present invention provides considerable improvement over the prior art. Because the RPO etch is performed in an end-point mode, the present invention provides a method for forming a gate with a reduced corner recess in an adjacent shallow trench isolation. The end-point mode RPO etch reduces the amount of overetch required to completely remove the RPO layer. The RPO layer can be completely removed from over the source and drain regions while the shallow trench isolation suffers much less corner recessing than in conventional processes. Because there is a much less recessed corner on the shallow trench isolation, trapped polysilicon and nitride residues are reduced. Also, juction leakage associated with salicide formation is reduced.

Another advantage of the present invention is that it proivdes a larger pre-metal dip processing window than a conventional process. In a conventional process a longer pre-metal dip or a rework pre-metal dip will etch the RPO layer covering the second area. This can cause silicide formation in the second area. In the present invention, the thin nitrogen containing layer is exposed to the pre-metal dip. Because the silicon nitride or silicon oxynitride of the thin nitrogen containing layer etch much slower in a HF wet etch than silicon oxide, the pre-metal dip processing window is larger in the process of the present invention. The larger processing window can allow for rework of the pre-metal dip.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a prior art device with a corner recess in the shallow trench isolation due to etching.

FIGS. 2, 3, 4, 5 & 6 illustrate sequential sectional views of a process for forming and etching a resist protect oxide layer according to the invention.

DETAILED DESCRIPTION OF THE INVENTION

Figure 4:
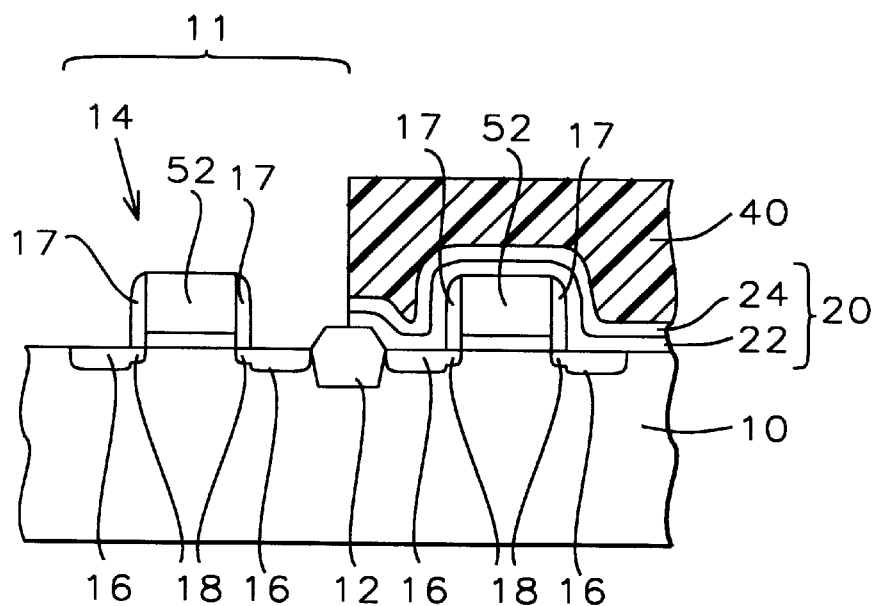

The present invention will be described in detail with reference to the accompanying drawings. The present invention provides a method for forming and etching a resist protect oxide layer, which provides improved etch selectivity to a shallow trench isolation and an increased pre-metal dip processing window. The major steps of ther present invention are shown in table 1.

Table 1
1. form Shallow Trench Isolation (STI)
2. grow a gate oxide layer on the substrate
3. deposit a polysilicon gate electrode layer on the gate oxide layer
4. define polysilicon gate electrode layer
5. form N/P LDD region
6. form nitride spacer
7. form N+, P+ S/D region
8. deposit thin oxide layer of RPO
9. deposit thin nitride or oxynitride layer of RPO (can be performed in-situ)
10. coat photoresist (PR)
11. expose RPO mask (define salicide and non-salicide regions)
12. RPO etch (endpoint mode)
13. pre-metal dip (wet etch)
14. deposit titanium
15. silicon ion mixing implant
16. first RTA anneal forming $TiSi_x$
17. APM remove unreacted titanium
18. second RTA anneal
19. ILD deposition
20. contact photo
21. contact etching (new recipe)

As shown in FIG. 1, the inventors' previous process comprises forming a shallow trench isolation (12) between gates (14) on a semiconductor substrate (10). A resist protect oxide layer (100) is formed over the shallow trench isolation (12) and gates (14) then etched away in a first area (11) for silicide formation. In the inventors' previous process, the etching steps, especially resist protect oxide etch, can cause a corner recess (12A) in the shallow trench isolation (12). Also, the resist protect oxide layer (100) is etched over a second area (13) during pre-metal dip step, which can lead to silicide formation on the second area (13).

Referring to FIG. 2, the present invention begins by forming a shallow trench isolation (12) on a semiconductor substrate (10) as is known in the art. The substrate has a first area (11) such as for a cell device and a second area (13) such as for an Input/Output device (I/O). The first area (11) and the second area (13) are separated by the shallow trench isolation (12). In the preferred embodiment, the first area (11) is a cell area where silicide contacts are formed, and the second area (13) is an I/O area without silicide contacts.

Still referring to FIG. 2, a gate (14) is formed on the semiconductor substrate (10) in the first area (11). The gate can comprise a gate oxide or other barrier layer formed on the semiconductor substrate. Preferably the gate electrode is composed of polysilicon. The gate preferably further comprises LDD regions (18), nitride spacers (17), and source/drain regions (16).

Referring to FIG. 3, a resist protect oxide layer (20) is deposited on the semiconductor substrate (10), the shallow trench isolation (12), and the gate (14). The resist protect oxide layer (20) is preferably comprised of a thin oxide layer (22) and a thin nitrogen containing layer (24). The thin oxide layer (22) can be formed using CVD, LPCVD, or most preferably PECVD, and preferably has a thickness of between about 20 Angstroms and 1000 Angstroms. The thin nitrogen containing layer (24) can be composed of silicon nitride, formed using CVD, LPCVD, or most preferably PECVD, and preferably has a thickness of between about 20 Angstroms and 600 Angstroms. Alternatively, the thin nitrogen containing layer (24) can be composed of silicon oxynitride having a thickness of between about 20 Angstroms and 1000 Angstroms. If the notrogen containing layer (24) is composed of silicon oxynitride, the oxide layer (22) can be omitted because oxynitride's stress is less than nitrogen, so the oxynitride could use a native oxide layer as the buffer oxide.

The thin oxide layer (22) and the thin nitrogen containing layer (24) can be performed in the same or a different chamber. In the preferred embodiment, the thin nitrogen containing layer (24) is formed in-situ (in the same chamber as the thin oxide layer (22).

Referring to FIG. 4, a photoresist mask (40) is formed on the resist protect oxide layer (20) using conventional photolithography and the resist protect oxide layer (20) is etched, thereby exposing the first area (11). The resist protect oxide (20) is left over the second area to prevent silicide formation. The resist protect oxide layer (20) is etched using an anisotropic etch performed in an end-point mode.

A key advantage of the present invention is that the resist protect oxide layer (20) can be etched in an endpoint mode thereby reducing the amount of overetch required to assure that the resist protect oxide layer (20) is completely removed over the first area (11). By sensing the concentration of nitrogen present in the etch chamber ambient, the etch can be stopped when the resist protect oxide is completely removed with very little overetch. The end-point detection can be performed using various techniques known in the art, including: ellipsometry, reflectometry, interferometry, and emissivity measurement. Preferably the end-point is detected by the nitrogen containing layer (24) spectrum drop signal. The resist protect oxide layer is preferably etched using a chemistry comprising $C_2F_6$, $C_3F_8$, $CHF_3$ & Ar.

Figure 5:
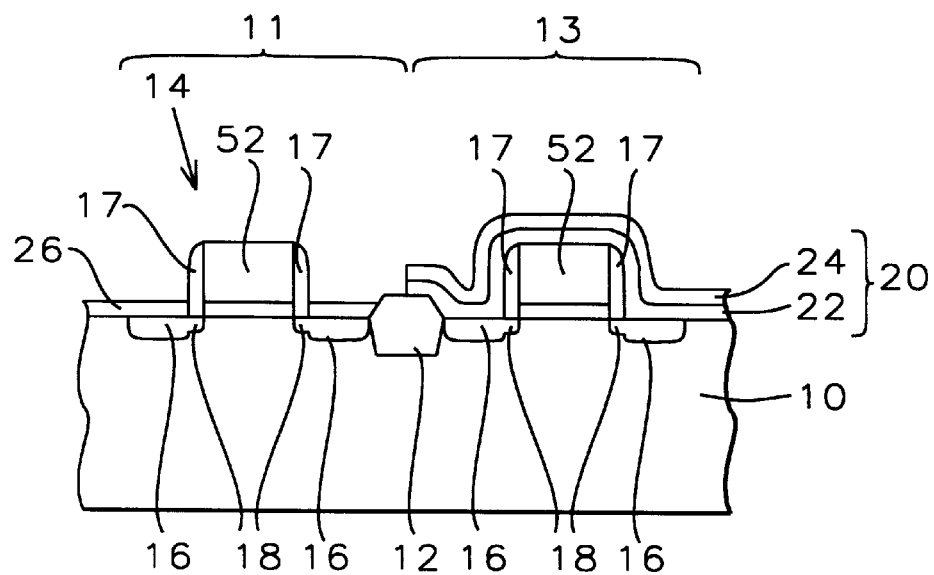

Referring to FIG. 5, silicide regions (26) can then be formed on the source and drain regions (16) using a conventional salicide process. The first step of a conventional salicide process is a pre-metal dip in a HF solution to remove oxide residue and other contaminants. The silicide can be comprised of $TiSi_x$, $CoSi_{PtSix}$, $WSi_x$, $MoSi_x$, or $TaSi_x$.

Another key advantage of the present invention is that the exposed thin nitrogen containing layer (22) of the resist protect oxide layer (20) has a much slower etch rate in an HF pre-metal dip than a conventional silicon oxide resist protect oxide. The slower etch rate provides a larger processing window than with a conventional resist protect oxide. The etch rate of the thin nitrogen containing layer (24) composed of silicon nitride according to the present invention is less than 180 Angstroms per minute, and the etch rate of the thin nitrogen containing layer (24) composed of silicon oxynitride according to the present invention is less than 180 Angstroms per minute.

Preferably, the pre metal etch is a 100:1 HF solution for a time of between about 80 seconds and 100 seconds, and more preferably about 90 seconds. This etch has improved the Rs-poly. The inventors' prior HF pre-metal dip etch was for 60seconds. The Rs-poly was not stable and excess STI was removed to form a recess corner (12A).

Figure 6:
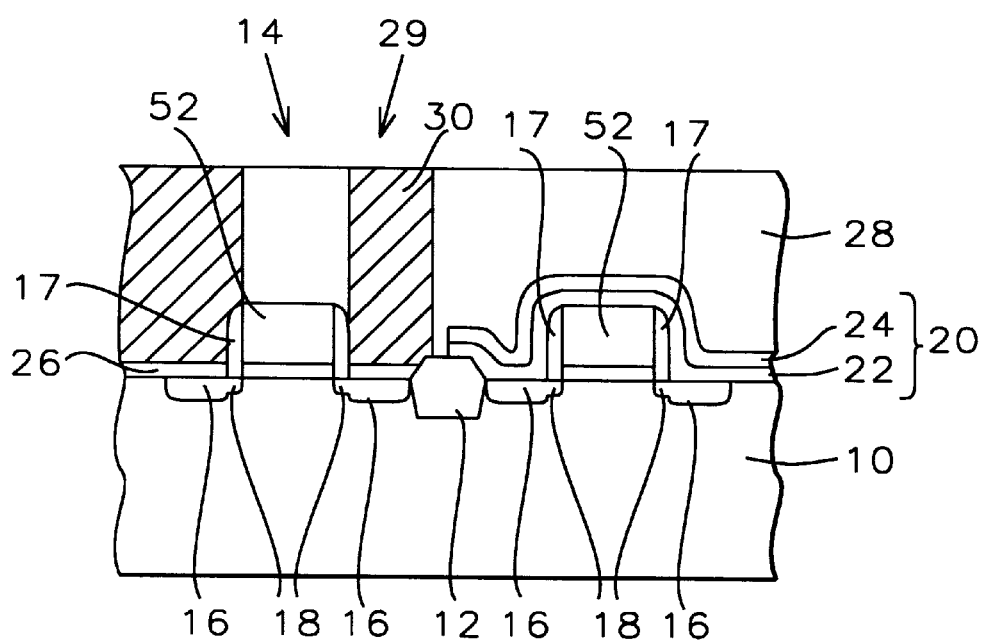

In the preferred embodiment, shown in FIG. 6, the semiconductor device manufacturing continues in a conventional method. After forming the silicide regions (26), an interlevel dielectric layer (28) is formed over the silicide regions (26), the shallow trench isolation (12) and the gate (14). The interlevel dielectric layer (28) is patterned using conventional photolithography and etching processes to form a contact opening (29) over the source and/or drain regions (16). A contact (30) is formed in the contact opening.

While the invention has been particularly shown and described with reference to the preferred embodiments thereof, it will be understood by those skilled in the art that various changes in form and details may be made without departing from the spirit and scope of the invention.

What is claimed is:

1. A method for forming and etching a resist protect oxide layer, which provides improved etch selectivity to a shallow trench isolation and an increased pre-metal dip processing window, comprising the steps of:
   a. forming a shallow trench isolation on a semiconductor substrate; said semiconductor substrate having a first area and a second area; said first area being separated from said second area by said shallow trench isolation;
   b. forming a gate on said first area of said semiconductor substrate; said gate comprising source and drain regions;
   c. depositing a resist protect oxide layer over said semiconductor substrate, said gate and said shallow trench isolation; said resist protect oxide layer consisting of silicon oxynitride;
   d. forming a photoresist mask having an opening over said first area;
   e. etching said resist protect oxide layer using an end-point etch mode; thereby exposing said first area of said semiconductor substrate;
   f. removing said photoresist mask; and
   g. forming silicide regions over said source and drain regions.

2. The method of claim 1 wherein said resist protect oxide layer is etched using a an etch chemistry comprising $C_2F_6$, $C_3F_8$, $CHF_3$ and Ar.

3. The method of claim 2 wherein the end-point for the etch of said resist protect oxide is detected using said silicon oxynitride layer's spectrum drop signal.

4. A method for forming and etching a resist protect oxide layer, which provides improved etch selectivity to a shallow trench isolation and an increased pre-metal dip processing window, comprising the steps of:
   a. forming a shallow trench isolation on a semiconductor substrate; said semiconductor substrate having a first area and a second area; said first area being separated from said second area by said shallow trench isolation;
   b. forming a gate on said first area of said semiconductor substrate; said gate comprising source and drain regions;
   c. depositing a resist protect oxide layer over said semiconductor substrate, said gate and said shallow trench isolation; said resist protect oxide layer comprising a nitrogen containing layer consisting of silicon oxynitride and having a thickness of between about 20 Angstroms and 1000 Angstroms;
   d. forming a photoresist mask having an opening over said first area;
   e. etching said resist protect oxide layer to expose said first area of said semiconductor substrate using an etch chemistry comprising $C_2F_6$, $C_3F_8$, $CHF_3$ and Ar; in an end-point etch mode;
   f. removing said photoresist mask; and
   g. forming silicide regions over said source and drain regions using a process comprising an HF pre-metal dip.

5. The method of claim 4 wherein the end-point for the etch of said resist protect oxide (20) is detected using said nitogen containing layer's spectrum drop signal.

6. The method of claim 4 wherein the etch rate of said nitrogen containing layer composed of silicon oxynitride during said HF pre-metal dip is less than 180 Angstroms per minute.

\* \* \* \* \*